United States Patent
Lin et al.

(10) Patent No.: US 10,884,527 B2
(45) Date of Patent: Jan. 5, 2021

(54) TOUCH DISPLAY DEVICE

(71) Applicant: Sitronix Technology Corp., Hsinchu County (TW)

(72) Inventors: Chih-Yu Lin, Hsinchu County (TW); Tsun-Sen Lin, Hsinchu County (TW)

(73) Assignee: Sitronix Technology Corp., Hsinchu County (TW)

( * ) Notice: Subject to any disclaimer, the term of this patent is extended or adjusted under 35 U.S.C. 154(b) by 0 days.

(21) Appl. No.: 15/663,809

(22) Filed: Jul. 30, 2017

(65) Prior Publication Data

US 2018/0032196 A1 Feb. 1, 2018

Related U.S. Application Data

(60) Provisional application No. 62/369,187, filed on Jul. 31, 2016, provisional application No. 62/415,471, filed on Oct. 31, 2016.

(51) Int. Cl.
  *G06F 3/041* (2006.01)
  *G06F 3/044* (2006.01)
  *H01L 27/12* (2006.01)

(52) U.S. Cl.
  CPC .......... *G06F 3/0412* (2013.01); *G06F 3/044* (2013.01); *H01L 27/124* (2013.01); *G06F 3/04164* (2019.05); *G06F 3/04166* (2019.05)

(58) Field of Classification Search
  CPC ...... G06F 3/0412; G06F 3/044; G06F 3/0416; H01L 27/124; H01L 27/3262; H01L 27/323; G09G 3/3607
  USPC .......................................................... 345/174
  See application file for complete search history.

(56) References Cited

U.S. PATENT DOCUMENTS

| 9,377,919 | B1* | 6/2016 | Kang ................. G06F 3/044 |
| 10,026,347 | B2* | 7/2018 | Xu .................... G09G 3/20 |
| 10,026,352 | B2* | 7/2018 | Miao ................. G09G 3/36 |
| 10,255,840 | B2* | 4/2019 | Yang ................. G02F 1/1362 |
| 10,474,271 | B2* | 11/2019 | Kim .................. G06F 3/0416 |
| 2010/0182273 | A1 | 7/2010 | Noguchi |
| 2013/0044282 | A1* | 2/2013 | Kuwabara ........... G02F 1/1333 349/96 |
| 2013/0162570 | A1* | 6/2013 | Shin ................... G06F 3/041 345/173 |
| 2014/0028616 | A1* | 1/2014 | Furutani ............. G09G 3/3607 345/174 |
| 2014/0176464 | A1* | 6/2014 | Kim ................... G06F 3/044 345/173 |
| 2015/0002955 | A1* | 1/2015 | Li ..................... G02F 1/133514 359/891 |
| 2015/0158387 | A1 | 6/2015 | Satoh |

(Continued)

FOREIGN PATENT DOCUMENTS

| CN | 103941507 A | 7/2014 |
| CN | 104169850 A | 11/2014 |

(Continued)

*Primary Examiner* — Fred Tzeng
(74) *Attorney, Agent, or Firm* — Winston Hsu (57) ABSTRACT

A touch display device includes a display area and a non-display area and further includes a touch electrode layer; wherein a plurality of sensing electrodes is configured in the electrode layer; wherein each sensing electrode extends from the display area to the non-display area and is coupled to a driver chip via a connection structure; wherein the connection structure locates in the non-display area.

13 Claims, 12 Drawing Sheets

(56) References Cited

U.S. PATENT DOCUMENTS

| | | | | |
|---|---|---|---|---|
| 2015/0220202 A1* | 8/2015 | Choung | G06F 3/0416 | 345/174 |
| 2015/0243686 A1* | 8/2015 | Lee | G02F 1/13624 | 257/43 |
| 2015/0243687 A1* | 8/2015 | Lee | H01L 29/7869 | 257/43 |
| 2015/0243689 A1* | 8/2015 | Lee | H01L 27/1225 | 257/43 |
| 2015/0243723 A1* | 8/2015 | Cho | H01L 27/124 | 257/43 |
| 2015/0277655 A1* | 10/2015 | Kim | G06F 3/044 | 345/174 |
| 2015/0309634 A1* | 10/2015 | Lee | G06F 3/0412 | 345/173 |
| 2016/0027356 A1* | 1/2016 | Cheng | H01L 27/12 | 345/173 |
| 2016/0063924 A1* | 3/2016 | Oh | H01L 27/1229 | 345/690 |
| 2016/0064465 A1* | 3/2016 | Oh | H01L 27/3262 | 257/43 |
| 2016/0103360 A1* | 4/2016 | Wang | G02F 1/133514 | 349/12 |
| 2016/0116997 A1 | 4/2016 | Kim | | |
| 2016/0124280 A1* | 5/2016 | Park | G02F 1/136286 | 349/43 |
| 2016/0188087 A1* | 6/2016 | Sun | G06F 3/044 | 345/173 |
| 2016/0188091 A1* | 6/2016 | Sun | G06F 3/044 | 345/174 |
| 2017/0010507 A1* | 1/2017 | Cheng | G02F 1/136286 | |
| 2017/0061853 A1* | 3/2017 | Yang | G02F 1/1362 | |
| 2017/0185193 A1* | 6/2017 | Kim | H01L 27/323 | |
| 2017/0185196 A1* | 6/2017 | Kim | G06F 3/0412 | |
| 2017/0194404 A1* | 7/2017 | Park | H01L 27/3262 | |
| 2017/0256649 A1* | 9/2017 | Takamaru | G02F 1/1368 | |
| 2017/0262120 A1* | 9/2017 | Liu | G06F 3/0412 | |
| 2017/0345845 A1* | 11/2017 | Wu | G09G 3/3677 | |
| 2018/0261653 A1* | 9/2018 | Ye | H01L 27/323 | |
| 2018/0301472 A1* | 10/2018 | Matsukizono | G02F 1/1368 | |

FOREIGN PATENT DOCUMENTS

| | | |
|---|---|---|
| CN | 104269414 A | 1/2015 |
| CN | 104375297 A | 2/2015 |
| CN | 104461187 A | 3/2015 |
| CN | 104656327 A | 5/2015 |
| CN | 105278748 A | 1/2016 |
| JP | 2009-244958 A | 10/2009 |
| JP | 2015-509245 A | 3/2015 |
| JP | 2017-182146 A | 10/2017 |
| KR | 10-2016-0047962 A | 5/2016 |
| TW | 201433961 A | 9/2014 |
| TW | 201441732 | 11/2014 |
| TW | I522868 B | 2/2016 |
| TW | 201616304 | 5/2016 |
| TW | I537635 B | 6/2016 |
| TW | 201624249 | 7/2016 |

\* cited by examiner

TOUCH DISPLAY DEVICE

CROSS REFERENCE TO RELATED APPLICATIONS

This application claims the benefit of U.S. Provisional Application No. 62/369,187 filed on 2016 Jul. 31 and No. 62/415,471 filed on 2016 Oct. 31, the contents of which are incorporated herein in their entirety.

BACKGROUND OF THE INVENTION

1. Field of the Invention

The present invention relates to a touch display device, and more particularly, to a touch display device with a low manufacturing cost and a high aperture ratio.

2. Description of the Prior Art

Along with the development of the touch sensing technique, the commercially available touch panels are extensively used for various sizes or products such as mobile phone, GPS navigator system, tablet PC, PDA, and laptop PC, owing to their convenience and practicality.

The panel manufacturers continue to develop thinner and more accurate touch panels. In recent year, touch panels of an in-cell structure attract lots of attention. Via building sensing elements inside the display structure of the panel, the in-cell structure eliminates a layer. The visible distance between the user's finger and what the user is touching on the touch panel is therefore reduced, creating a more direct contact with the content displayed and enabling taps and gestures to be more responsive. In addition, the touch panel becomes thinner since the layer is eliminated in the in-cell structure.

Generally, the prior art may use a jumper wire connection structure consist of VIA or conductive routing in the display structure to implement connections among the sensing components in the panel or between each of the sensing components and an external driver chip. For example, Taiwan patents numbers 201624249, 1527365, and 201616304 use the jumper wire connection structure with the VIA to implement the connections among the sensing components in the panel or between each of the sensing components and the external driver chip. However, adopting the jumper wire connection requires additional routing area and reduces an area which allows the pixel to penetrate, resulting in that the aperture ratio of the panel is decreased. Moreover, the number of masks of producing the panel is increased. The manufacturing cost of the panel is increased, therefore. Thus, how to improve the aperture ratio and reduces the manufacturing cost of the panel becomes a topic to be discussed.

SUMMARY OF THE INVENTION

In order to solve the above issue, the present invention provides a touch display device.

In an aspect, the present invention discloses a touch display device comprising a display area and a non-display area. The touch display device further comprises a touch electrode layer; wherein a plurality of sensing electrodes is configured in the electrode layer; wherein each sensing electrode extends from the display area to the non-display area and is coupled to a driver chip via a connection structure; wherein the connection structure locates in the non-display area.

In another aspect, the present invention discloses a touch display device comprising a display area and a non-display area. The touch display device further comprises a touch electrode layer, wherein a plurality of sensing electrodes is configured in the touch electrode layer; a driver chip; and at least one multiplexer, configured in the non-display area; wherein the at least one multiplexer is coupled to the multiple sensing electrodes through a plurality of first connection components and coupled to the driver chip through a second connection component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
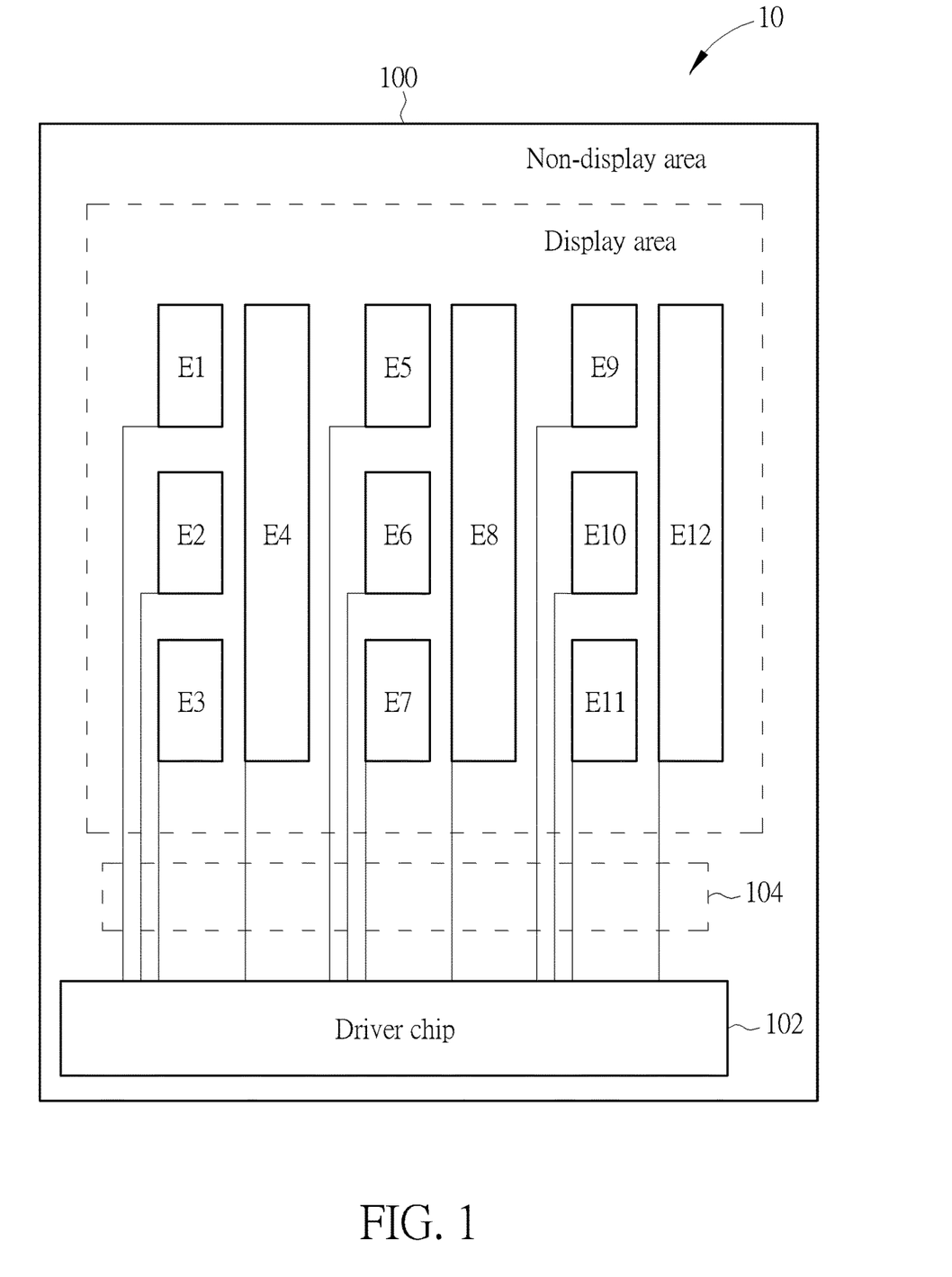
FIG. 1 is a schematic diagram of a touch display device according to an example of the present invention.
Figure 2:
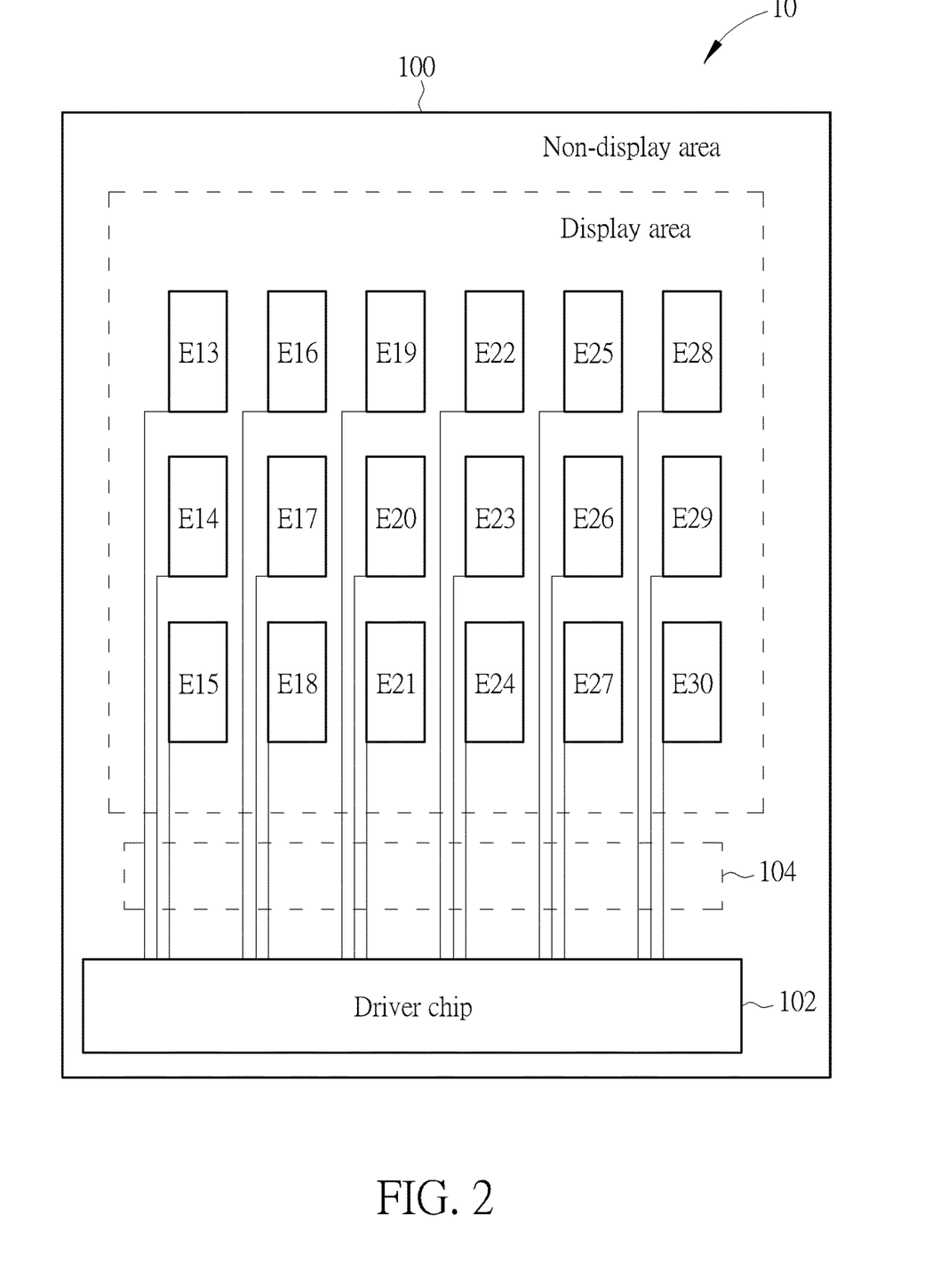
FIG. 2 is a schematic diagram of a touch display device according to an example of the present invention.

Please refer to FIG. 1, which is a schematic diagram of a touch display device 10 according to an example of the present invention. The touch display device 10 may be an electronic product with a touch display panel, such as a smart phone and a tablet, and is not limited herein. As shown in FIG. 1, the touch display device 10 comprises a panel 100 and a driver chip 102. The panel 100 comprises a display area and a non-display area, wherein display components (e.g. a pixel array (not shown in FIG. 1)) and a plurality of sensing electrodes E1-E12 in a touch electrode layer are configured in the display area. The sensing electrodes E1-E12 are utilized to sense capacitance variations, to generate information of determining whether the touch display device 10 is touched by an external object and touch positions. In an example, the touch electrode layer is a conductive layer providing a common voltage in the touch display device 10. Note that, the sensing electrodes E1-E12 may be driving electrodes of providing driving signals or detecting electrodes of receiving sensing signals. For example, the sensing electrodes E1-E3, E5-E7 and E9-E11 may be the driving electrodes and the sensing electrodes E4, E8 and E12 may be the detecting electrodes when the panel 100 is a mutual capacitance panel. Or, please refer to FIG. 2, the touch electrode layer may configure each of sensing electrodes E13-E30 at each touch point when the panel 100 is a self-capacitance touch panel. In addition, FIGS. 1 and 2 shows the sensing electrodes E1-E30 for illustrations and the sensing electrodes in the touch display device 10 are not limited to the sensing electrodes E1-E12 shown in FIG. 1 or the sensing electrodes E13-E30 shown in FIG. 2.

In the example of FIG. 1, the sensing electrodes E1-E12 respectively extend from the display area to the non-display area of the panel 100 and connect the driver chip 102 via a connection structure 104 in the non-display area, wherein the driver chip 102 may be implemented by processes such as Chip on Glass (COG), Chip on Film (COF), Tape Carrier Package (TCP) process, Quad Flat Package (QFP) and Chip on Board (COB), and is not limited herein. Because the sensing electrodes E1-E12 directly extend to the non-display area, the display area in the panel 100 does not comprise a jumper wire connection structure implemented by VIA. As a result, an aperture ratio of the panel 100 is increased and the number of masks used for implementing the panel 100 is decreased, so as to reduce the manufacturing cost of the panel 100.

Figure 3:
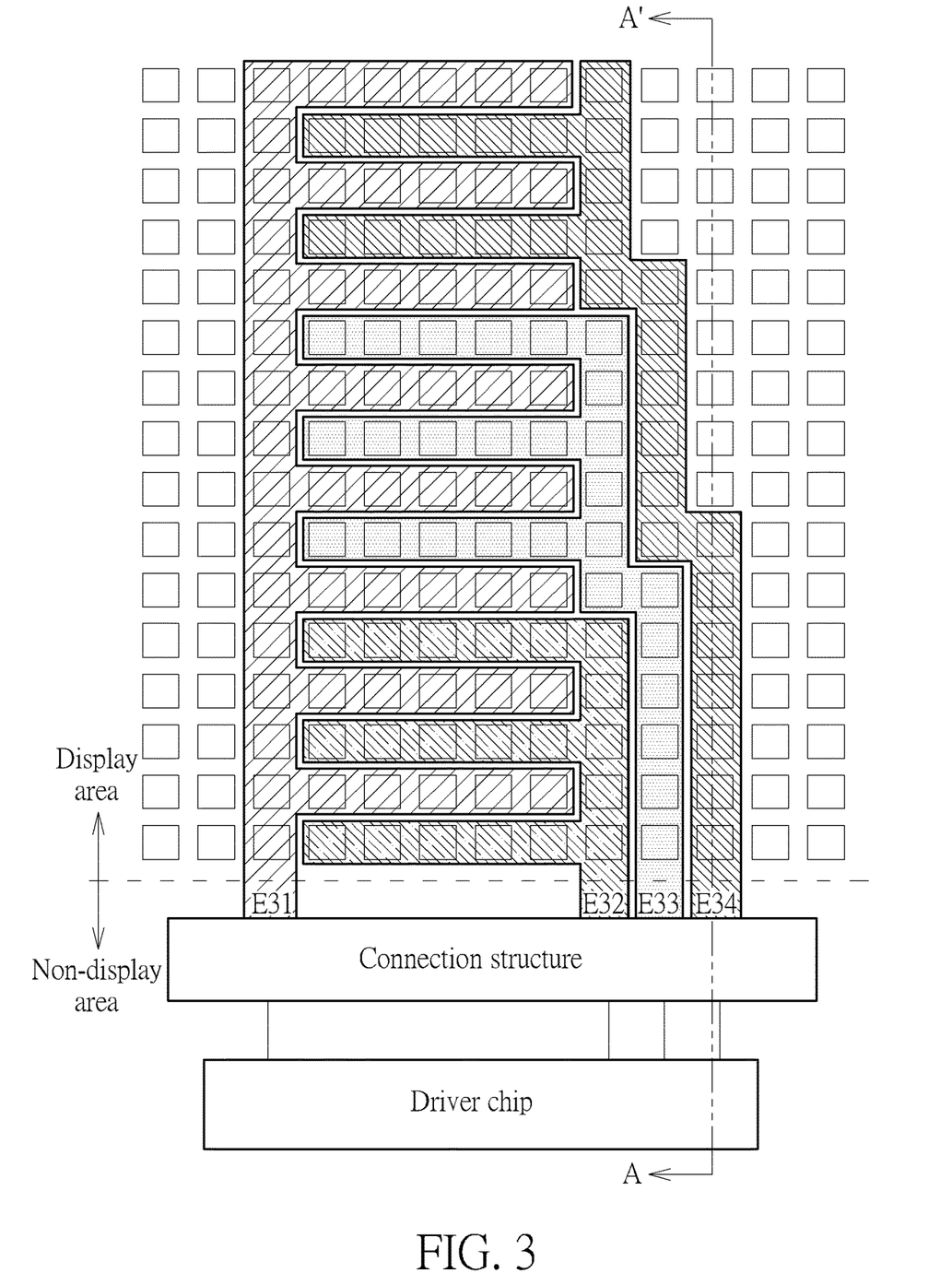
FIG. 3 is a schematic diagram of parts of sensing electrodes in a touch display device according to an example of the present invention.

According to different applications and design concepts, the shape of the sensing electrodes can be realized by various methods. Please refer to FIG. 3, which is a schematic diagram of parts of sensing electrodes in the touch display device according to an example of the present invention. For example, the sensing electrodes E31-E34 shown in FIG. 3 may be the sensing electrodes E1-E4, and are not limited herein. In FIG. 3, each block represents a display component (e.g. a common electrode of the pixel array) of the touch display device. As shown in FIG. 3, the sensing electrodes E31-E34 are configured in a stagger arrangement and each of the sensing electrodes E31-E34 extends to the non-display area to connect the driver chip via a connection structure in the non-display area.

Figure 4:
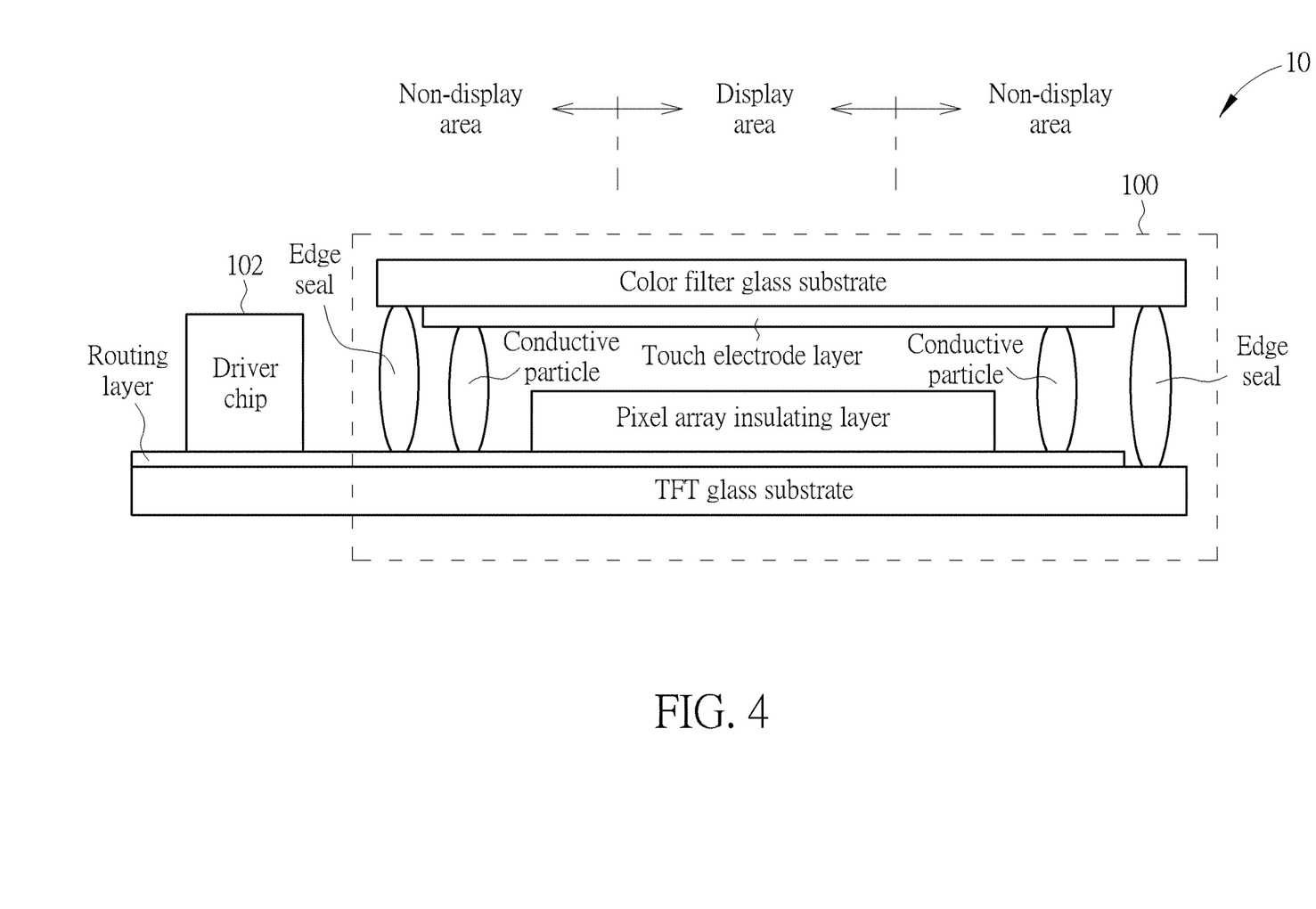
FIG. 4 is a cross section diagram of an embodiment of the touch display device shown in FIG. 1.

Please refer to FIG. 4, which is a cross-section diagram of a cross-section line $\overline{AA'}$ shown in FIG. 3 according to an example of the present invention. In the touch display device 10 shown in FIG. 4, a color filter glass substrate and a thin film transistor (TFT) glass substrate are connected by edge seals, the touch electrode layer is configured on one side of the color filter glass substrate opposite to the TFT glass substrate, and the pixel array is configured in a pixel array insulating layer on another side of the TFT glass substrate opposite to the color filter glass substrate. As shown in FIG. 4, the touch electrode layer used for configuring the sensing electrodes E1-E12 extends from the display area to non-display area and connects the driver chip 102 via the connection structure 104 and a routing layer of the touch display device 10, wherein the connection structure 104 comprises conductive particles in the non-display area. In an example, the conductive particles are implemented by anisotropic conductive materials and the routing layer may be transparent or metal conductive electrodes. Because the touch electrode layer in the display area does not configure additional connection structure (e.g. VIA or conductive routings) in the display area, spaces which are between the sensing electrodes E1-E12 and driver chip 102 and allow the pixels to penetrate would not be occupied by the additional connections. Further, the number of masks used for implementing the panel 100 can be decreased, so as to reduce the manufacturing cost of the panel 100.

Figure 5:
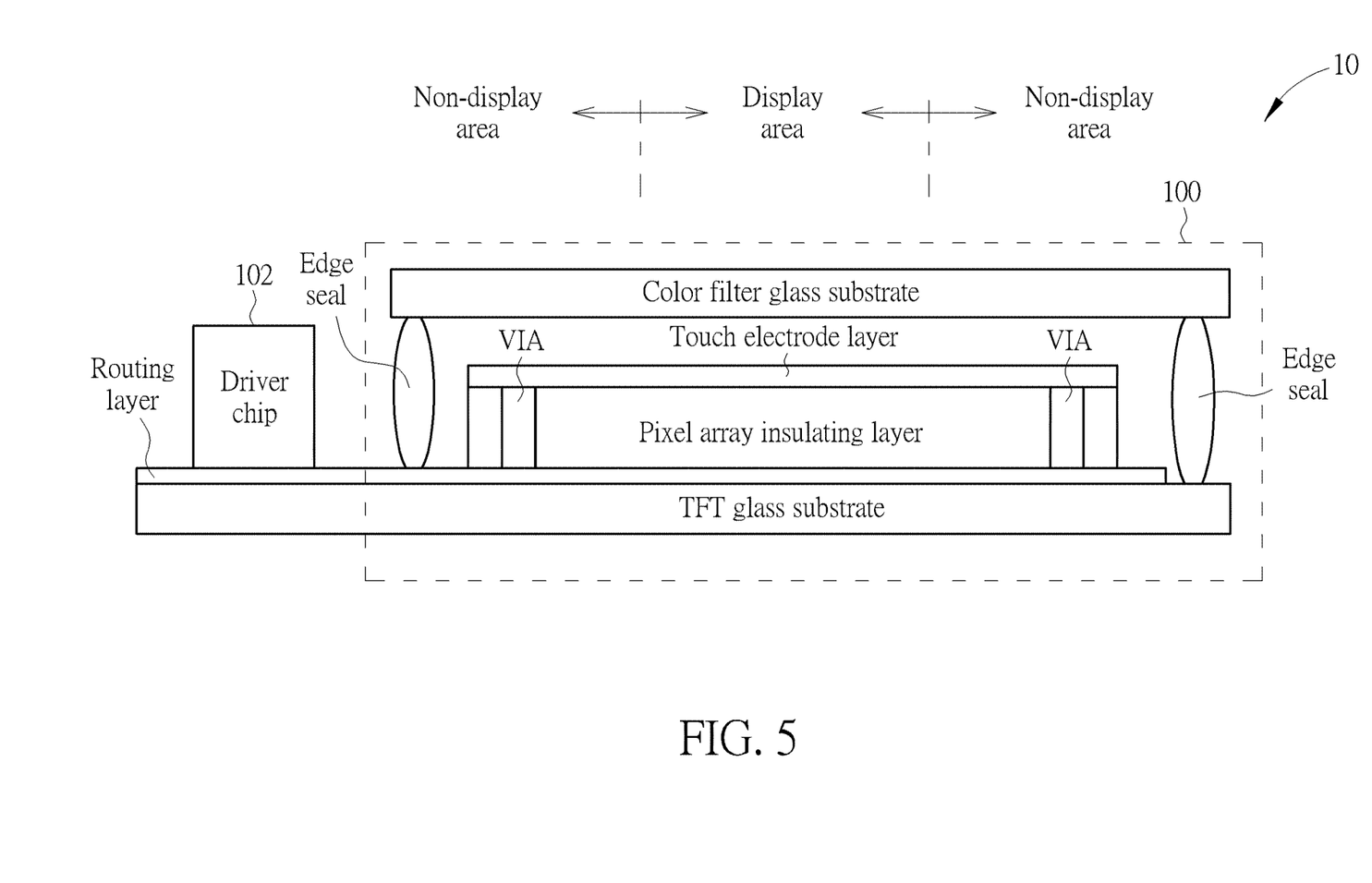
FIG. 5 is a cross section diagram of another embodiment of the touch display device shown in FIG. 1.

Please refer to FIG. 5, which is a cross-section diagram according to another example of the present invention. The touch display device 10 shown in FIG. 5 is similar to that shown in FIG. 4, thus the components with similar functions use the same symbols. In comparison with FIG. 4, the touch electrode layer is configured on the pixel array insulating layer in FIG. 5 instead. In this example, the connection structure 104 comprises VIAs which are in the non-display area and penetrate the pixel array insulating layer. The sensing electrodes in the touch electrode layer connect the routing layer through the VIAs in the non-display area and penetrating the pixel array insulating layer and then are connected to the driver chip 102.

Figure 6:
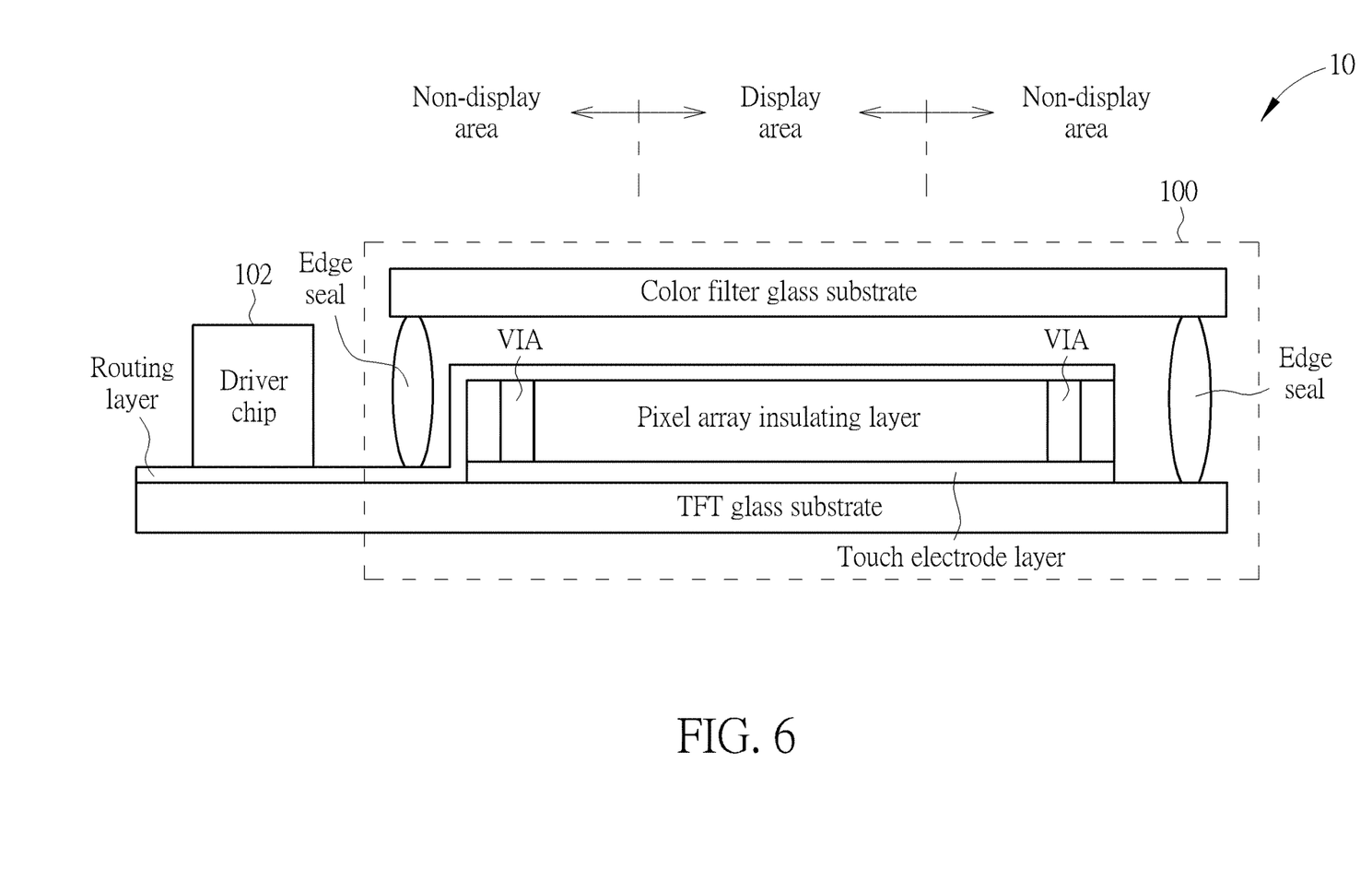
FIG. 6 is a cross section diagram of other embodiment of the touch display device shown in FIG. 1.

Please refer to FIG. 6, which is a cross-section diagram according to still another example of the present invention. The touch display device 10 shown in FIG. 6 is similar to that shown in FIG. 5, thus the components with similar functions use the same symbols. In the example shown in FIG. 6, the touch electrode layer with the sensing electrodes E1-E12 is configured between the pixel array insulating layer and the TFT glass substrate instead. In this example, the connection structure 104 also comprises VIAs which are in the non-display area and penetrate the pixel array insulating layer. The sensing electrodes in the touch electrode layer connect the driver chip 102 through the routing layer and the VIAs in the non-display area and penetrating the pixel array insulating layer.

According to different applications and design concepts, the connections among the sensing electrodes E1-E12 and the driver chip 102 can be realized by various methods. In an example, parts of sensing electrode E1-E12 may couple to each other. For example, the sensing electrodes E1, E5 and E9 may couple to each other after extending to the non-display area, the sensing electrodes E2, E6 and E10 may couple to each other after extending to the non-display area, and the sensing electrodes E3, E7 and E11 may couple to each other after extending to the non-display area, to make the touch electrodes on the touch electrode layers are parallelly connected in the non-display area. By connecting parts of sensing electrodes in parallel, the number of routings connected to the driver chip 102 can be reduced so as to decrease the number of pins of the driver chip 102. As a result, the size of the driver chip 102 can be shrunk and the yield of configuring (e.g. bonding) the driver chip 102 on the TFT glass substrate can be improved.

In another example, parts of the sensing electrodes E1-E12 are connected to each other in the driver chip 102. In this example, the connections among the sensing electrodes E1-E12 do not occupy the area on the panel, which is beneficial for realizing the panel 100 with full screen or narrow border feature.

In still another example, the sensing electrodes E1-E12 are respectively connected to the driver chip 102. In this example, the driver chip 102 scans the sensing electrodes by a block-division method; and the driver chip 102 may contiguously and repeatedly scan the driving lines consisted of driving electrodes in the sensing electrodes E1-E12 and scan lines consisted of detecting electrodes in the sensing electrodes E1-E12 by a time-division method.

Figure 7:
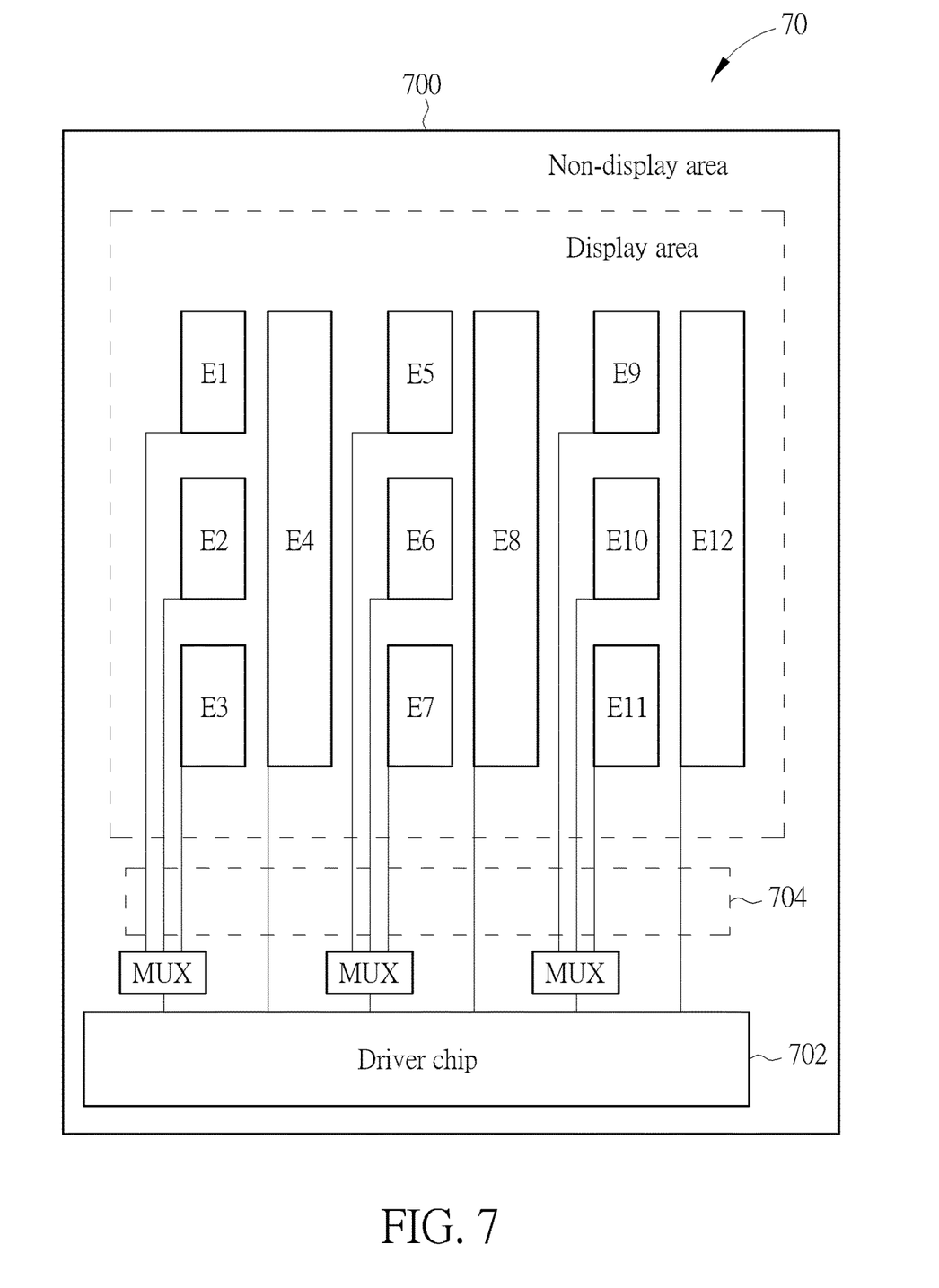
FIG. 7 is a schematic diagram of a touch display device according to an example of the present invention.

Please refer to FIG. 7, which is a schematic diagram of a touch display device 70 according to an example of the present invention. The touch display device 70 is similar to the touch display device 10 shown in FIG. 1, thus the components with similar functions use the same symbols. In comparison with the touch display device 10 shown in FIG.

1, the touch display device 70 adds a plurality of multiplexers MUX to reduce the number of routings connected to the driver chip 702. As shown in FIG. 7, the sensing electrodes E1-E3 directly extend to the non-display area and are coupled to the driver chip 702 via a multiplexer MUX; the sensing electrodes E5-E7 directly extend to the non-display area and are coupled to the driver chip 702 via another multiplexer MUX; and the sensing electrodes E9-E11 directly extend to the non-display area and are coupled to the driver chip 702 via still another multiplexer MUX. In this example, the driver chip 702 may achieve the touch function by block-division scanning or time-division scanning through the multiplexers MUX. By adding the multiplexers MUX, the number of routings connected to the driver chip 702 can be reduced so as to decrease the number of pins required by the driver chip 702. Under such a condition, the size of the driver chip 702 can be shrunk and the yield of configuring (e.g. bonding) the driver chip 702 on the TFT glass substrate can be improved. In addition, the added multiplexers MUX do not increase the number of the masks because the multiplexers MUX can be integrated with driving circuits (e.g. gate driving circuits) of the panel 700. That is, the yield of the touch display device 70 can be improved by adding the multiplexers MUX without increasing the manufacturing cost.

Please note that, the positions of the multiplexers MUX are not limited to be the bottom side of the panel 700 and can be configured at random positions in the non-display area. For example, the multiplexers MUX may be configured in the non-display area at the top side, left side or right side of the panel 700. In addition, the number of multiplexers MUX and the number of sensing electrodes coupled to a single multiplexer MUX may vary according to different applications and design concepts.

In FIG. 7, the sensing electrodes E1-E3, E5-E7 and E9-E11 may be directly or indirectly coupled to the multiplexers MUX via a plurality of first connection components and each of the multiplexers MUX is coupled to the driver chip 702 via a second connection component. In details, the plurality of sensing electrodes may be coupled to a single multiplexer MUX via the plurality of first connection components; or, the plurality of sensing electrodes may connect a routing layer via the plurality of first connection components and then is connected to the multiplexer MUX via the routing layer; and is not limited herein. The first connection components may be realized by the conductive particles or VIAs in the non-display area and the second connection component may be realized by a conductive routing in the routing layer. Because the number of the second connection components is smaller than that of the first connection components by adopting the multiplexers MUX, the number of pins required by the driver chip 702 can be reduced. The size of the driver chip 702 is shrunk and the yield of bonding the driver chip and the panel 700 is improved, therefore.

Note that, the number of multiplexers MUX may alter according to different applications and design concepts. For example, all of the sensing electrodes E1-E12 of the panel 700 may connect the driver chip 702 via a single multiplexer MUX. In other words, the panel 700 only needs the single multiplexer MUX and a single routing between the multiplexer MUX and the driver chip 702 to achieve the connection between each of sensing electrodes and the driver chip 702.

Figure 8:
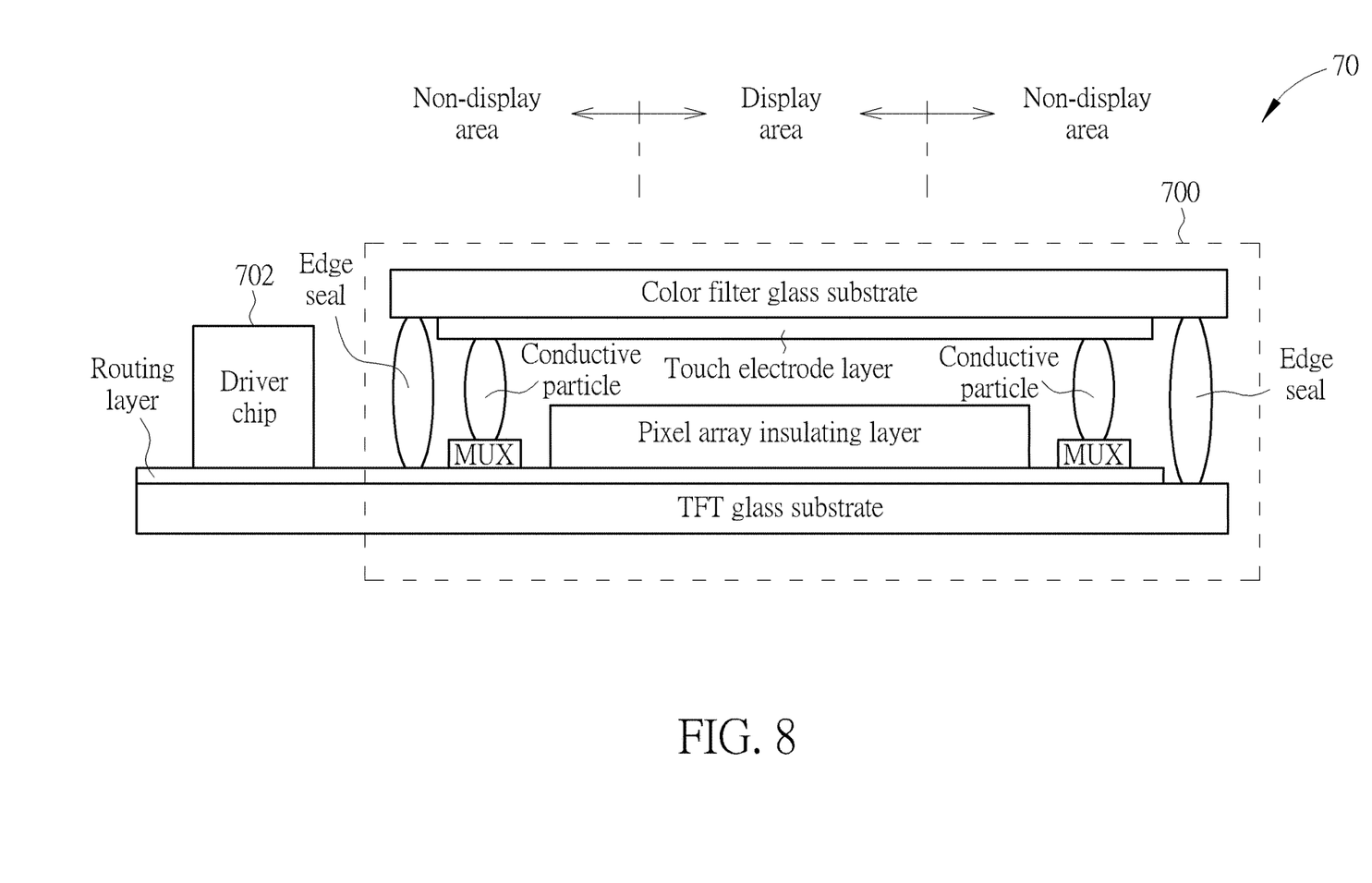
FIG. 8 is a schematic diagram of an embodiment of the touch display device shown in FIG. 7.

Please refer to FIG. 8, which is a cross-section diagram of an example of the touch display device 70 shown in FIG. 7. In the touch display device 70 shown in FIG. 8, the color filter glass substrate and the TFT glass substrate are connected by the edge seals, the touch electrode layer is configured on the side of the color filter glass substrate opposite to the TFT glass substrate, and the pixel array of display images is configured in the pixel array insulating layer on the side of the TFT glass substrate opposite to the color filter glass substrate. As shown in FIG. 8, the touch electrode layer used to configured the sensing electrodes E1-E12 extends from the display area to the non-display area, is coupled to the multiplexers MUX through the conductive particles and connects the driver chip 702 through a conductive routing (i.e. the second connection component) in a routing layer. Because the touch electrode layer in the display area does not configure additional connection structure (e.g. VIA), the spaces which are between the sensing electrodes E1-E12 and driver chip 702 and allow the pixels to penetrate would not be occupied by the additional connections. Further, the number of masks used for implementing the panel 700 can be decreased, so as to reduce the manufacturing cost of the panel 700.

Figure 9:
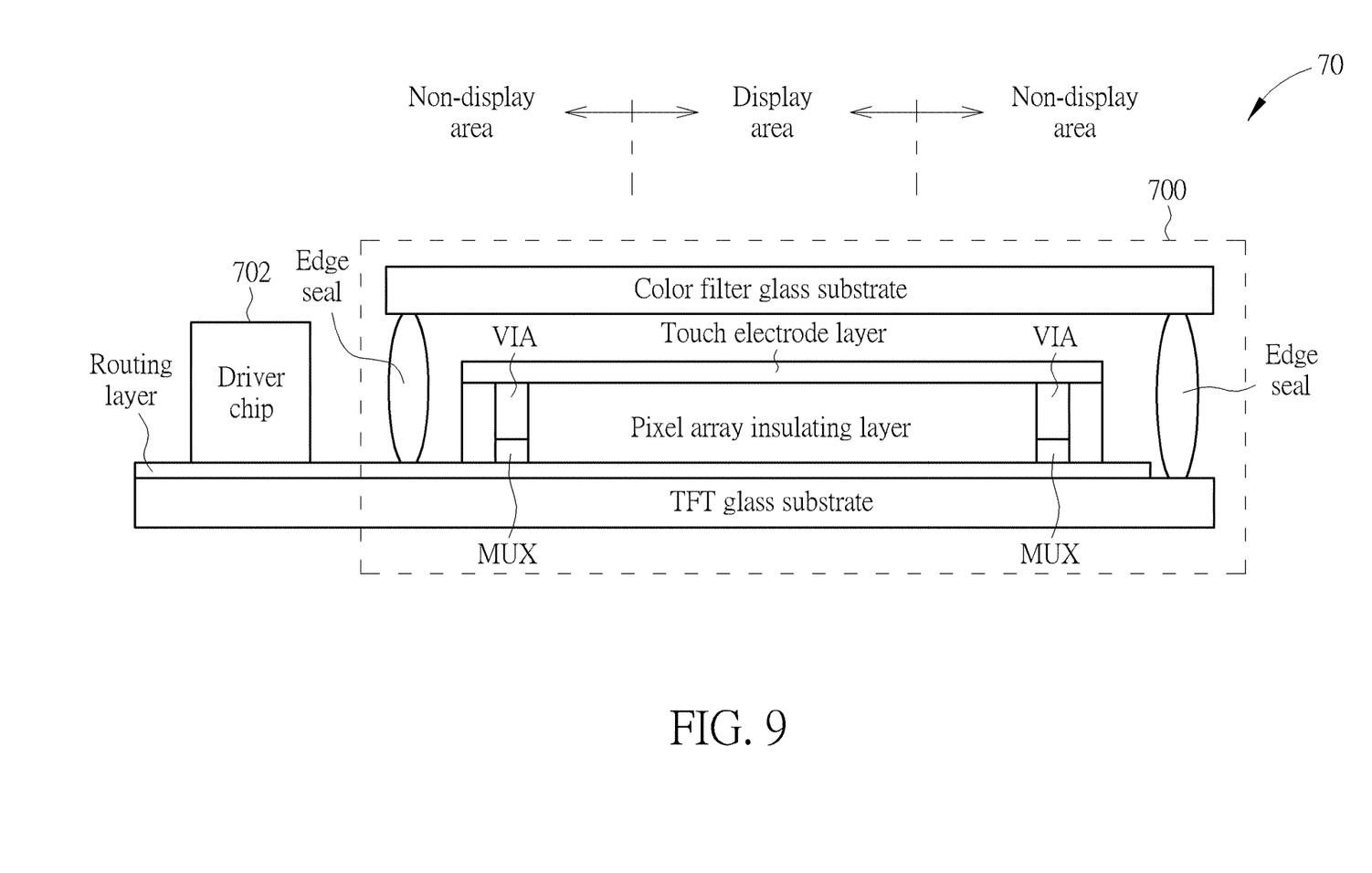
FIG. 9 is a schematic diagram of another embodiment of the touch display device shown in FIG. 7.

Please refer to FIG. 9, which is a cross-section diagram of the touch display device 70 according to another example of the present invention. The touch display device 70 shown in FIG. 9 is similar to that shown in FIG. 8, thus the components with similar functions use the same symbols. In comparison with FIG. 8, the touch electrode layer is configured on the pixel array insulating layer in FIG. 9 instead. In this example, the connection structure 104 is coupled to the multiplexers MUX through VIAs (i.e. the first connection components) which are in the non-display area and penetrate the pixel array insulating layer. Next, the multiplexers MUX are connected to the driver chip 702 via a conductive routing (i.e. the second connection component) in the routing layer.

Figure 10:
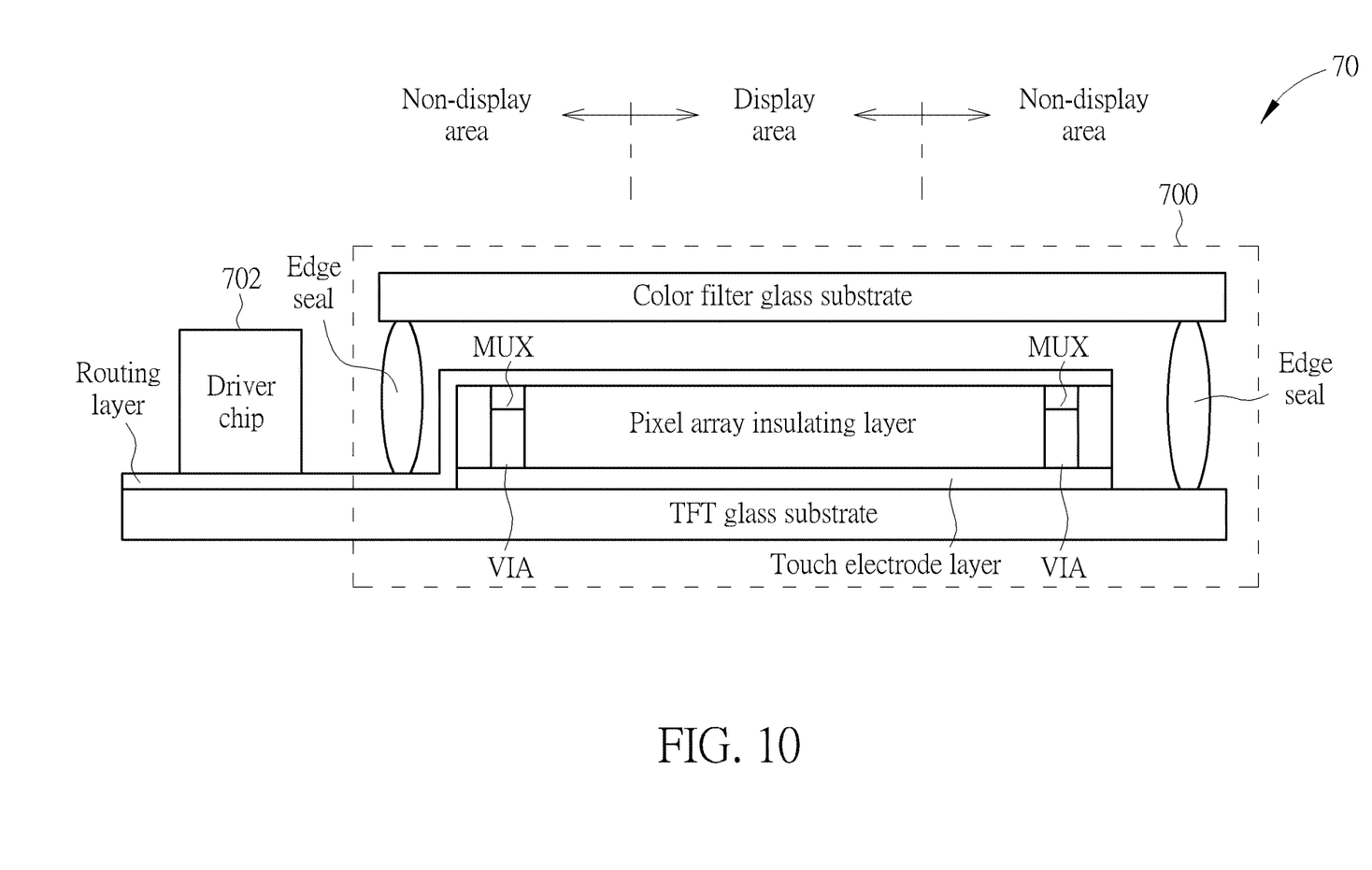
FIG. 10 is a schematic diagram of still another embodiment of the touch display device shown in FIG. 7.

Please refer to FIG. 10, which is a cross-section diagram of the touch display device 70 according to still another example of the present invention. The touch display device 70 shown in FIG. 10 is similar to that shown in FIG. 9, thus the components with similar functions use the same symbols. In the example shown in FIG. 10, the touch electrode layer comprising the sensing electrodes E1-E12 is configured between the pixel array insulating layer and the TFT glass substrate instead. In this example, the connection structure 104 is coupled to the multiplexers MUX through VIAs (i.e. the first connection components) which are in the non-display area and penetrate the pixel array insulating layer. Next, the multiplexers MUX are connected to the driver chip 702 via a conductive routing (i.e. the second connection component) in the routing layer.

Figure 11:
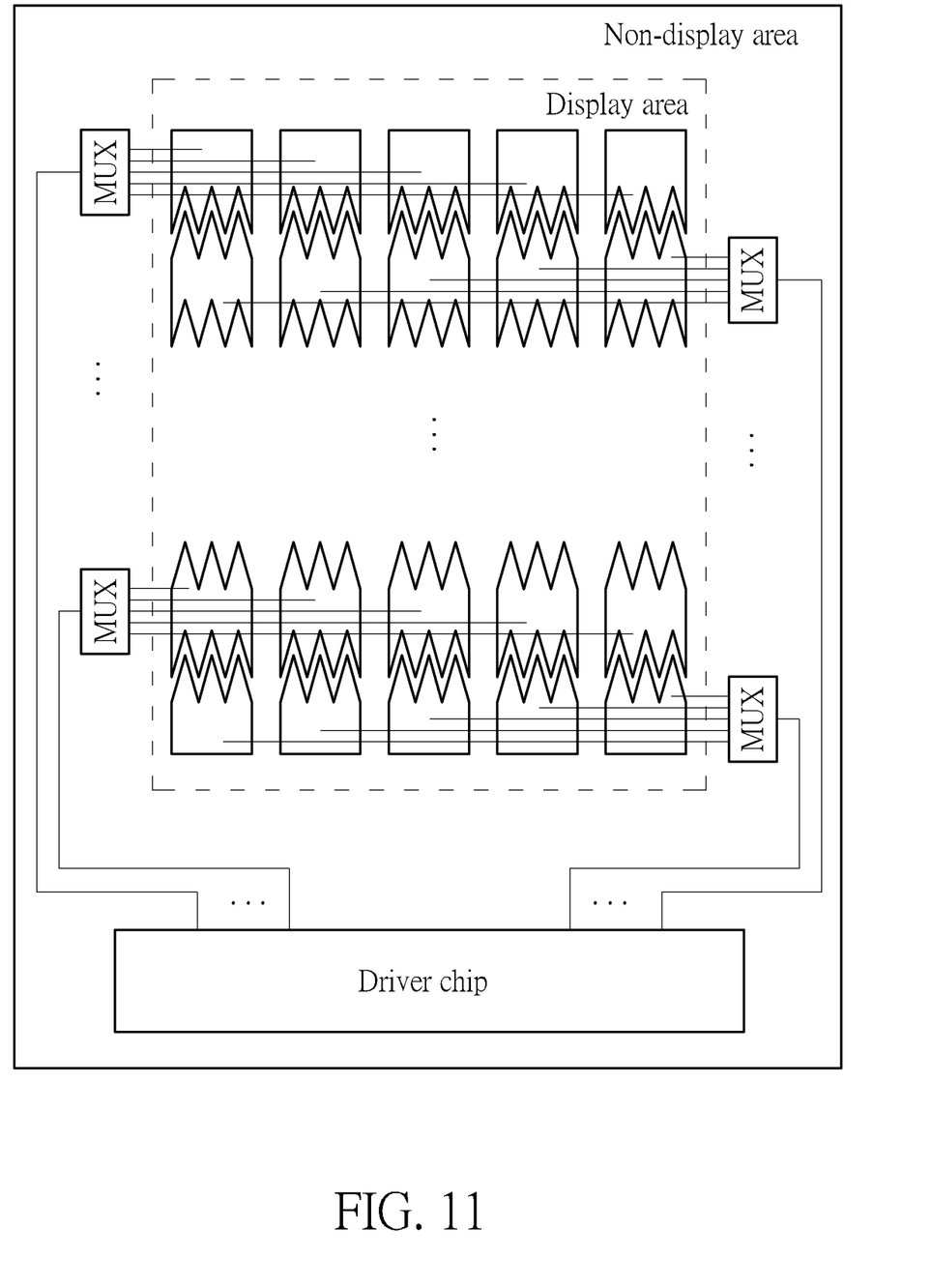
FIG. 11 is a schematic diagram of a touch display device according to an example of the present invention.

Please refer to FIG. 11, which is a schematic diagram of a touch display device with self-capacitance touch panel according to an example of the present invention. In this example, the shape of the sensing electrode is jagged. Note that, the sensing electrode can be realized in any shape that is able to achieve self-capacitance touch control and is not limited herein. In this example, the sensing electrodes of the same row extend to the non-display area through spaces between the sensing electrodes and connect the same multiplexer MUX. With the multiplexer MUX, the driver chip is able to achieve touch control function by adopting the time-division scanning or the block-division scanning.

According to different applications and design concepts, single multiplexer MUX is not limited to be coupled to the sensing electrodes of the same row. In an example, the multiplexer MUX may be coupled to the sensing electrodes of the same column instead.

Figure 12:
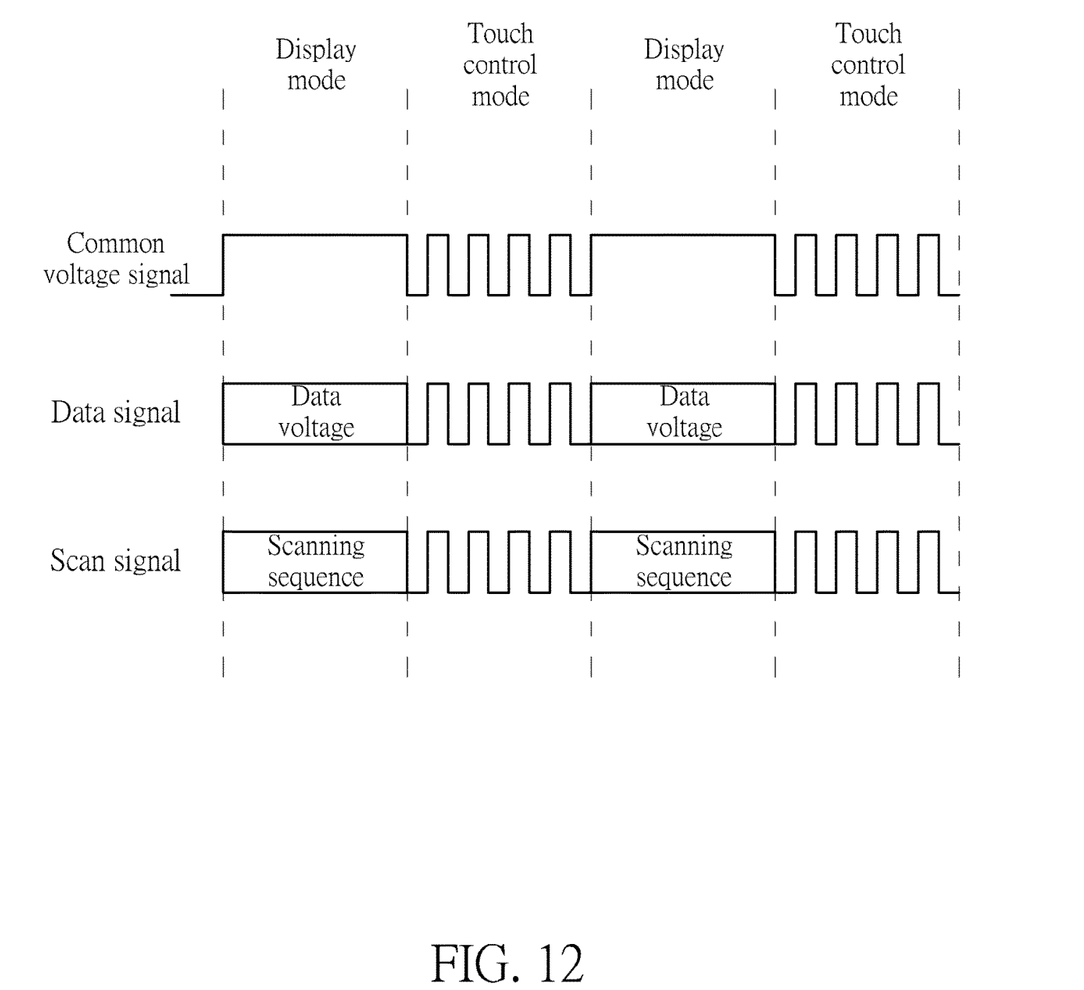
FIG. 12 is a schematic diagram of related signals in touch display device according to an example of the present invention.

In order to reduce noises during sensing the capacitance variations, the driver chip in the touch display device generates the driving signals for driving the sensing electrodes and the signals for driving display components of the touch display device with an identical waveform. Please refer to FIG. 12, which is a schematic diagram of related signals in the touch display device according to an example of the present invention. FIG. 12 shows a data signal, a scanning signal and a common voltage signal of a display component (e.g. a pixel), wherein the data signal is utilized to adjust a data voltage of a pixel electrode of the pixel, the scanning signal is utilized to adjust a gate voltage of a gate electrode of the pixel and the common voltage signal is utilized to adjust a common voltage of a common electrode. In the example of the present invention, the common electrode is a sensing electrode for sensing the capacitance variation and generating the information for determining touches of external objects. As shown in FIG. 12, the common voltage signal is kept at a constant value, and the data signal and the scanning signal varies based on displayed images and display scanning timing sequence in a display mode, respectively. In a touch control module, periodic pulses are generated as the common voltage signals to sense the capacitance variation. Since the data signal and the scanning signal with the same waveform as the periodic pulses are generated, the common electrode (sensing electrode), the pixel electrode and the gate electrode receive the same waveform in the touch control mode, and thus the voltage differences among the common electrode, the pixel electrode and the gate electrode are reduced. Under such a condition, the capacitance variation on the common electrode would not be affected by the pixel electrode and the gate electrode. The environmental effects on the capacitance variation of the common electrode can be decreased, therefore. As a result, the noise during sensing the capacitance variations is reduced.

To sum up, the sensing electrodes of the touch display device extends from the display area to the non-display area of the panel, respectively, and connect the driver chip of the touch display device through the connection structure configured in the non-display area. Under such a condition, the display area of the panel does not comprise the jumper wire connection structure with the VIA. The aperture ratio of the display area of the panel is increased, therefore. Moreover, the number of masks of implementing the panel can be decreased, so as to reduce the manufacturing cost of the panel. Further, the connection structure may adopt the multiplexers to reduce the number of routings connected to the driver chip, to improve the yield of coupling the driver chip and the panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch display device including a display area and a non-display area and further comprising:
   a touch electrode layer; wherein a plurality of sensing electrodes are configured in the touch electrode layer; wherein each sensing electrode extends from the display area to the non-display area and is coupled to a driver chip via a connection structure;
   wherein the connection structure locates in the non-display area;
   wherein the plurality of sensing electrodes are a plurality of driving electrodes for providing a plurality of driving signals or a plurality of detecting electrodes for receiving a plurality of sensing signals;
   wherein there is no vertical interconnect access (VIA) or conductive route in the touch electrode layer in the display area of the touch display device.

2. The touch display device of claim 1, wherein the connection structure comprises a plurality of conductive particles configured in the non-display area.

3. The touch display device of claim 2, wherein the touch electrode layer is configured on a color filter glass substrate and the connection structure is coupled to the driver chip through a routing layer on a thin film transistor (TFT) glass substrate.

4. The touch display device of claim 1, wherein the connection structure comprises vertical interconnect access (VIA) configured in the non-display area.

5. The touch display device of claim 4, wherein the touch electrode layer is configured on a first side of a pixel array insulating layer of a thin film transistor (TFT) glass substrate, a routing layer coupled to the driver chip is configured on a second side of the pixel array insulating layer, and the VIA of the connection structure penetrates the pixel array insulating layer to connect the touch electrode layer and the routing layer.

6. The touch display device of claim 1, wherein a first sensing electrode and a second sensing electrode of the plurality of sensing electrodes are coupled to each other in the non-display area.

7. The touch display device of claim 1, wherein a first sensing electrode and a second sensing electrode of the plurality of sensing electrodes are coupled to each other in the driver chip.

8. A touch display device comprising a display area and a non-display area and further comprising:
   a touch electrode layer, wherein a plurality of sensing electrodes are configured in the touch electrode layer;
   a driver chip; and
   at least one multiplexer, configured in the non-display area;
   wherein the at least one multiplexer is coupled to the multiple sensing electrodes through a plurality of first connection components and each of the at least one multiplexer are coupled to the driver chip through a second connection component;
   wherein the plurality of sensing electrodes are a plurality of driving electrodes for providing a plurality of driving signals or a plurality of detecting electrodes for receiving a plurality of sensing signals;
   wherein there is no vertical interconnect access (VIA) or conductive routing in the touch electrode layer in the display area of the touch display device.

9. The touch display device of claim 8, wherein each of the sensing electrodes extends from the display area to the non-display area and the plurality of first connection components are in the non-display area of the touch display device.

10. The touch display device of claim 9, wherein the touch electrode layer is configured on a color filter glass substrate, the at least one multiplexer and the second connection component are configured on a thin film transistor (TFT) glass substrate, and the plurality of first connection components are a plurality of conductive particles to make the at least one multiplexer coupled to the multiple sensing electrodes through the plurality of conductive particles in the non-display area and coupled to the driver chip through the second connection component.

11. The touch display device of claim 9, wherein the touch electrode layer is configured on a first side of a pixel array insulating layer on a thin film transistor (TFT) glass substrate, the at least one multiplexer is configured on a second side of the pixel array insulating layer, the plurality of the first connection components comprise a plurality of vertical interconnect accesses (VIAs) penetrating the pixel array insulating layer, and the second connection component is configured in a routing layer on the second side of the pixel array insulating layer.

12. A touch display device including a display area and a non-display area and further comprising:
   a touch electrode layer; wherein a plurality of sensing electrodes are configured in the touch electrode layer; wherein each sensing electrode extends from the display area to the non-display area and is coupled to a driver chip via a connection structure;
   wherein the connection structure locates in the non-display area;
   wherein the plurality of sensing electrodes are a plurality of driving electrodes for providing a plurality of driving signals or a plurality of detecting electrodes for receiving a plurality of sensing signals;
   wherein the connection structure comprises vertical interconnect access (VIA) configured in the non-display area;
   wherein the touch electrode layer is configured on a first side of a pixel array insulating layer of a thin film transistor (TFT) glass substrate, a routing layer coupled to the driver chip is configured on a second side of the pixel array insulating layer, and the VIA of the connection structure penetrates the pixel array insulating layer to connect the touch electrode layer and the routing layer.

13. A touch display device comprising a display area and a non-display area and further comprising:
   a touch electrode layer, wherein a plurality of sensing electrodes are configured in the touch electrode layer;
   a driver chip; and
   at least one multiplexer, configured in the non-display area;
   wherein the at least one multiplexer is coupled to the multiple sensing electrodes through a plurality of first connection components and each of the at least one multiplexer is coupled to the driver chip through a second connection component;
   wherein the plurality of sensing electrodes are a plurality of driving electrodes for providing a plurality of driving signals or a plurality of detecting electrodes for receiving a plurality of sensing signals;
   wherein each of the sensing electrodes extends from the display area to the non-display area and the plurality of first connection components are in the non-display area of the touch display device;
   wherein the touch electrode layer is configured on a first side of a pixel array insulating layer on a thin film transistor (TFT) glass substrate, the at least one multiplexer is configured on a second side of the pixel array insulating layer, the plurality of the first connection components comprise a plurality of vertical interconnect accesses (VIAs) penetrating the pixel array insulating layer, and the second connection component is configured in a routing layer on the second side of the pixel array insulating layer.

* * * * *